United States Patent [19]
Lang et al.

[11] Patent Number: 5,355,237
[45] Date of Patent: Oct. 11, 1994

[54] WAVELENGTH-DIVISION MULTIPLEXED OPTICAL INTEGRATED CIRCUIT WITH VERTICAL DIFFRACTION GRATING

[75] Inventors: Robert J. Lang, Pleasanton; Siamak Forouhar, Pasadena, both of Calif.

[73] Assignee: The United States of America as represented by the Administrator of the National Aeronautics and Space Administration, Washington, D.C.

[21] Appl. No.: 33,512

[22] Filed: Mar. 17, 1993

[51] Int. Cl.⁵ .................. H04J 14/02; G02B 6/12
[52] U.S. Cl. .................. 359/130; 359/128; 359/163; 385/14; 385/37
[58] Field of Search .......... 359/124, 128–129, 359/130, 133, 163; 385/14, 24, 27, 37

[56] References Cited

U.S. PATENT DOCUMENTS

| | | | |
|---|---|---|---|
| 4,111,524 | 9/1978 | Tomlinson, III | 350/96.19 |
| 4,335,933 | 6/1982 | Palmer | 350/96.19 |
| 4,367,040 | 1/1983 | Goto | 356/44 |
| 4,474,424 | 10/1984 | Wagner | 350/96.16 |
| 4,630,255 | 12/1986 | Gouali et al. | 370/3 |
| 4,648,083 | 3/1987 | Giallorenzi | 367/149 |
| 4,690,489 | 9/1987 | Neyer | 350/96.14 |
| 4,707,064 | 11/1987 | Dobrowolski et al. | 350/96.18 |
| 4,715,027 | 12/1987 | Mahapatra et al. | 359/130 |
| 4,735,478 | 3/1988 | Hiley et al. | 350/96.16 |
| 4,739,501 | 4/1988 | Fussganger | 370/3 |
| 4,740,951 | 4/1988 | Lizet et al. | 370/3 |
| 4,744,075 | 5/1988 | Buhrer | 370/3 |
| 4,745,591 | 5/1988 | Foley | 370/3 |
| 4,746,186 | 5/1988 | Nicia | 385/14 |
| 4,756,587 | 7/1988 | Sano et al. | 350/96.12 |
| 4,760,569 | 7/1988 | Mahlein | 385/37 |
| 4,761,777 | 8/1988 | Edwards et al. | 370/3 |
| 4,777,663 | 10/1988 | Charlton | 455/612 |
| 4,822,127 | 4/1989 | Kamiya et al. | 350/96.15 |
| 4,839,884 | 6/1989 | Schloss | 370/3 |
| 4,900,118 | 2/1990 | Yanagawa et al. | 350/96.15 |
| 4,989,937 | 2/1991 | Mahlein et al. | 350/96.15 |
| 4,993,796 | 2/1991 | Kapany et al. | 350/96.15 |
| 5,107,359 | 4/1992 | Ohuchida | 359/124 |
| 5,111,519 | 5/1992 | Mathis | 385/24 |
| 5,228,103 | 7/1993 | Chen et al. | 359/130 |

*Primary Examiner*—Richard E. Chilcot, Jr.
*Assistant Examiner*—Kinfe-Michael Negash
*Attorney, Agent, or Firm*—John H. Kusmiss; Thomas H. Jones; Guy M. Miller

[57] ABSTRACT

A semiconductor optical integrated circuit for wave division multiplexing has a semiconductor waveguide layer, a succession of diffraction grating points in the waveguide layer along a predetermined diffraction grating contour, a semiconductor diode array in the waveguide layer having plural optical ports facing the succession of diffraction grating points along a first direction, respective semiconductor diodes in the array corresponding to respective ones of a predetermined succession of wavelengths, an optical fiber having one end thereof terminated at the waveguide layer, the one end of the optical fiber facing the succession of diffraction grating points along a second direction, wherein the diffraction grating points are spatially distributed along the predetermined contour in such a manner that the succession of diffraction grating points diffracts light of respective ones of the succession of wavelengths between the one end of the optical fiber and corresponding ones of the optical ports.

28 Claims, 7 Drawing Sheets

WAVELENGTH-DIVISION MULTIPLEXED OPTICAL INTEGRATED CIRCUIT WITH VERTICAL DIFFRACTION GRATING

BACKGROUND OF THE INVENTION

1. Origin of the Invention

The invention described herein was made in the performance of work under a NASA contract, and is subject to the provisions of Public Law 96-517 (35 USC 202) in which the Contractor has elected not to retain title.

2. Technical Field

The invention is related to wave-division multiplexing optical communication systems using transmitters and receivers consisting of optical integrated circuits and optical fiber communication channels.

3. Background Art

In wave-division multiplexed optical communication systems, many different optical wavelength carriers provide independent communication channels in a single optical fiber. Future computation and communication systems place ever-increasing demands upon communication link bandwidth. It is widely recognized that optical fibers offer vastly higher bandwidth than conventional coaxial communications and that a single optical channel in a fiber waveguide uses a microscopically small fraction of the available bandwidth of the fiber (typically a few GHz out of several tens of THz). And it is also widely recognized that by sending several channels at different optical wavelengths down the fiber (i.e., wavelength division multiplexing, or WDM), this bandwidth may be more efficiently utilized.

If a single optical link transmits 2 Gbs (giga-bits per second), then an optical fiber contains the bandwidth to support upwards of ten thousand such links. However, current WDM implementations typically support only between two and four such links. This disparity is primarily due to two reasons. The first reason is that most WDM systems must be assembled from discrete transmitter and receiver devices (laser diodes and detector diodes). With this approach, the complexity and alignment requirements scale linearly with the number of channels while additional constraints (e.g., constraints on frequency stability) are added. The integrated devices reported thus far in the art use Y-branch couplers for beam combining, which yield a 50% loss with each factor of 2 increase in number of channels. The second reason is that currently available components for multiplexing (dichroic filters and holographic couplers) cannot discriminate among large numbers of closely-spaced channels. Channels must be spaced sufficiently far apart (e.g., from 3 to 5 nanometers) that only a small number of channels can fit within the roughly 50 nanometer gain bandwidth of a given laser active medium.

Single-chip implementations of WDM transmitters also do not exploit even the limits of current technology. For example, with a typical 5 mW laser diode dissipating 10 mW of power, a chip of power dissipation of 1 W/chip would still allow 100 channels on the chip. For a WDM receiver chip, the limits are even higher, since the power dissipated by a detector is negligible.

A natural application for high-density WDM ($\geq 8$ channels) is in links within or between computers. A typical parallel computer link consists of 32 or 64 channels, yet conventional communication links are serial. Use of a parallel WDM link would not only increase the channel capacity by up to a factor of 32, but would actually simplify the electronics at each end by eliminating the serial/parallel conversion bottleneck, reducing latency in the network. In addition, more advanced protocols can make use of WDM to implement control signals separate from a data stream. A "hot potato" computer architecture including an "optical switch node" has been proposed by John Sauer at the National Testbed Facility (NTF) at the University of Colorado that requires high-density WDM (nine channels or greater) fiber links between nodes. This system is designed from the ground up to incorporate WDM fiber communications, but therefore requires high density wavelength division multiplexing (HDWDM) technology.

The NTF "optical switch node" can be broken down into several functional blocks: it requires wavelength multiplexing/demultiplexing, detection and generation of 1.3 micron radiation, level restoration of 1.55 micron radiation (possibly) to compensate for insertion loss, and some electronic control logic and drive. These requirements are representative of the needs of any HDWDM system. All of these functional blocks could be realized with off-the-shelf optics and electronics. Laser diodes and detector diodes at 1.55 microns are commercially available, as are high-speed amplifiers and detectors. The WDM could be accomplished by microoptics (i.e., separately micropositioned lens, diffraction grating and laser array). However, such a "discrete" approach would likely be impractical due to the large size of the system and the large number of precise alignments that would be required among the optical components.

Techniques for multiplexing and demultiplexing between a single optical fiber comprising the multiplexed channel and plural optical fibers comprising the plural demultiplexed channels are known in the art. For example, multiplexing/demultiplexing with birefringent elements is disclosed in U.S. Pat. Nos. 4,744,075 and 4,745.991. Multiplexing/demultiplexing using optical bandpass filters (such as a resonant cavity) is disclosed in U.S. Pat. Nos. 4,707,064 and 5,111,519. Multiplexing/demultiplexing with interference filters is disclosed in U.S. Pat. Nos. 4,474,424 and 4,630,255 and 4,735,478. Multiplexing/demultiplexing using a prism is disclosed in U.S. Pat. No. 4,335,933. U.S. Pat. No. 4,740,951 teaches a complex sequence of cascaded gratings to demultiplex plural optical signals. U.S. Pat. Nos. 4,756,587 and 4,989,937 and 4,690,489 discloses optical coupling between adjacent waveguides to achieve a demultiplexing function. A similar technique is disclosed in U.S. Pat. No. 4,900,118. The foregoing techniques are limited by their discrete components to a small number of wavelengths in the multiplexed channel.

One way of overcoming such a limitation is to employ diffraction gratings to perform the multiplexing and demultiplexing functions. One problem with such an approach is that the input and output beams (the multiplexed and demultiplexed beams) are reflected by the grating at 180 degree angles, and are very closely spaced, a significant disadvantage due to the potential for cross-talk between the two beams. This is shown in U.S. Pat. Nos. 4,111,524 and 4,993,796. Such close spacing of the multiplexed and demultiplexed channels makes fabrication awkward and increases the likelihood of cross-talk. One way of overcoming this latter difficulty is to employ a curved diffraction grating which reflects the incoming signal at right angles. Such an approach is disclosed in U.S. Pat. No. 4,822,127. The problem with the latter technique is that the various wavelengths of the incoming single-channel fibers must be detected by an array comprising plural array sequences corresponding to the plurality of incoming signals to be detected. Such a structure is awkward for implementing WDM with a large number of channels.

The foregoing limitation is overcome in a technique in which a diffraction grating is combined with a lens, as disclosed in U.S. Pat. Nos. 4,777,663 and 4,839,884 and 4,367,040 and 4,739,501. The advantage of the lens and grating combination is that the plural optical fibers of the demultiplexed channels may interface directly with the single optical fiber of the multiplexed channel through the grating and lens combination. The problem with the lens and grating combination is that the lens is a large discrete component. Moreover, the diffraction grating itself is typically a discrete component. A related technique is disclosed in U.S. Pat. No. 5,107,359 employing two discrete components, namely either two diffraction gratings or a grating and a specular reflection surface.

Accordingly, none of the foregoing techniques are suitable for integrated circuit implementation and are therefore relatively large expensive devices incapable of exploiting the advantages of integrated circuits in WDM discussed above.

It is therefore one object of the invention to perform WDM multiplexing and demultiplexing functions in a WDM optical integrated circuit without discrete components such as a lens or specular reflection surface.

It is a related object of the invention to perform optical multiplexing in a WDM transmitter integrated circuit having orthogonal facets, one facet connected to the multiplexed channel optical fiber and plural optical sources or semiconductor laser diodes being near the other facet.

It is a further related object of the invention to provide optical demultiplexing in a WDM receiver integrated circuit having orthogonal facets, one facet connected to the multiplexed channel optical fiber and plural optical detectors or photodetector diodes being near the other facet.

The present invention described below recognizes that the NTF optical switch node and other high-rate communications architectures (e.g., supercomputing links and concurrent processors) are natural candidates for monolithic integration, which, among other benefits, would dramatically reduce the number of components, connections and alignments that must be made among a node's components. While lasers, detectors and electronics have all seen significant effort in discrete device fabrication as well as integration, relatively less effort has been focused on high-density WDM components. Thus, HDWDM components form an enabling technology for the much larger field of WDM opto-electronic integrated circuits (OEIC's).

Accordingly, it is a further object of the invention to provide vertical-diffraction-grating (VDG) integrated optical components for high-density WDM circuits. Such VDG components are formed in an integrated circuit, in contrast to the discrete waveguides employed in the prior art referenced above.

It is a related object to use such a VDG to implement a high density WDM transmitter by integrating the VDG with an array of lasers (laser diodes) with discrete, different wavelengths.

It is another related object of the invention to integrate a VDG coupler with an array of p-i-n edge-coupled diodes to make a single-chip receiver.

It is yet another related object of the invention is to provide an entire NTF optical switch node on a single monolithic substrate or integrated circuit chip.

A further object of the invention is to employ VDG's fabricated with compound semiconductor waveguides of the type including InP for 1.3 micron and 1.55 micron operation.

STATEMENT OF THE INVENTION

The invention is an integrated circuit or semiconductor substrate, preferably of the III–IV compound semiconductor type, having a facet coupled to a single optical fiber comprising the multiplexed communication channel and an array of semiconductor optical sources (for a transmitter/multiplexer) or optical detectors (for a receiver/demultiplexer) displaced from and disposed orthogonally with respect to the facet coupled to the optical fiber. The optical sources or detectors are formed an integrated circuit devices within the integrated circuit. A concave arcuate vertical diffraction grating (VDG) etched in a layer of the integrated circuit diffracts light traveling between the single optical fiber and the array of optical sources or detectors in a light path which makes essentially a 90 degree turn at the VDG. This permits the inputs ports and laser array to be disposed along one side of the substrate and the optical output (the single optical fiber) to be disposed along an orthogonal side of the substrate, thereby minimizing cross-talk therebetween and greatly easing fabrication by displacing the input and output connections, a significant advantage.

For a transmitter/multiplexer, each optical source in the array optical sources is a p-i-n diode laser (or laser diode) tuned to a different wavelength in a linear succession of wavelengths of the array. The lasers are uniformly spaced along the array. The VDG is "chirped", meaning that the spacing between adjacent grating points varies in accordance with a progression which assures that each wavelength in the linear succession of wavelengths emanating from the location of the corresponding laser in the array is diffracted by the VDG to the point on the integrated circuit facet at which the single optical fiber is connected.

This progression of wavelengths is defined by requiring that each pair of adjacent grating points in the VDG diffract two predetermined wavelengths (lying within the succession of wavelengths) from a pair of locations corresponding to their wavelengths along the laser array to the point of connection of the single optical fiber at the integrated circuit facet. The two predetermined wavelengths are selected so as to minimize aberration across the entire succession of wavelengths.

The lasers in the array are each tuned to respective ones of the succession of wavelengths by individual surface diffraction gratings etched longitudinally in the substrate surface at the output of respective lasers, each surface diffraction grating having a uniform spacing corresponding to the desired wavelength. Thus, an optical WDM VDG multiplexer is constructed entirely as an integrated circuit.

An optical WDM VDG demultiplexer is realized with an identical structure, except that the array of lasers and surface diffraction gratings is replaced by an array of p-i-n photodetector diodes formed in the substrate at corresponding locations.

The VDG is a thin shallow channel etched into the substrate surface, the channel constituting a saw-tooth path following the concave arcuate contour of the overall grating, the teeth points in the saw-tooth path constituting the grating points of the VDG. The VDG of the demultiplexer is identical to that of the multiplexer, as are the relative locations of the VDG, the single optical fiber connection and optical ports of the array of lasers (in the multiplexer) or photodetectors (in the demultiplexer).

Both the semiconductor lasers of the multiplexer and the photodetector diodes of the demultiplexer comprise integrated p-i-n quantum well semiconductor structures. Typically, fabrication of such devices requires removing semiconductor material in the region of the quantum well to be formed and then regrowing an epitaxial layer therein. In order to eliminate such a regrowth step, in one alternative embodiment of the invention the laser array (including the surface gratings thereof) of the multiplexer is formed on a second integrated circuit separate from a main integrated circuit having the VDG and the facet connected to the single optical fiber. The two integrated circuits are butt-coupled so that the laser array is located relative to the VDG as in the preferred embodiment. The two integrated circuits are fabricated with different semiconductor processing sequences in order to eliminate the necessity of a removal and epitaxial regrowth step.

Similarly, the photodetector diodes of the demultiplexer may be formed on separate butt-coupled substrates in the same manner to eliminate the necessity of a removal and regrowth step in fabricating the demultiplexer.

In another alternative embodiment of the invention, the array of surface gratings which tune the array of lasers to the succession of wavelengths is eliminated. Instead, the laser array is sandwiched between two identical mirror-image VDG's. One of the two VDG's corresponds to the VDG already described which diffracts light in one direction from the laser array to the single optical fiber. The other VDG diffracts light in an opposite direction from the laser array to a single spot on a facet of the substrate having a highly reflective coating. The light paths between the laser array and the highly reflective coating spot and between the laser array and the single optical fiber connection are symmetrical. Together, the two VDG's precisely tune each one of the lasers in the array to the corresponding wavelength in the succession of wavelengths.

In one version of the two-VDG embodiment of the invention just described, three butt-coupled substrates are employed, two of the substrates including the two respective VDG's and the third substrate sandwiched between the other two including the laser array. As before, the use of plural butt-coupled substrates eliminates the necessity of a removal and epitaxial regrowth step in fabricating the invention.

In a preferred implementation of the invention, the integrated circuit constitutes a GaAs substrate on which is formed an AlGaAs waveguide layer sandwiched between upper and lower AlGaAs cladding layers. The p-i-n embedded quantum well structure (of the lasers or of the detector diodes) is formed as a thin layer of pure GaAs in the middle of the waveguide layer, necessitating the regrowth step in the preferred embodiment as discussed above. A P+ GaAs layer overlies the upper cladding layer and a metal layer constituting the laser electrodes overlies the P+ GaAs layer. The lasers in the array are separated by channels etched through the metal layer, the P+ GaAs layer and most of the upper cladding layer.

In an alternative implementation of the invention, the integrated circuit constitutes an InP substrate having an InPGaAs waveguide layer thereover sandwiched between InPGaAs upper and lower cladding layers. The skilled worker may select other compound semiconductor structures for implementing the invention.

By juxtaposing the single multiplexed channel port (the single optical fiber) and the demultiplexed channel ports (the array of optical sources or detectors) at right angles to one another without the use of the prior art discrete grating-lens combination, crowding of components on the chip is reduced, greatly facilitating fabrication of an integrated circuit multiplexer or demultiplexer with a greater number of channels.

DETAILED DESCRIPTION OF THE INVENTION

Figure 1:
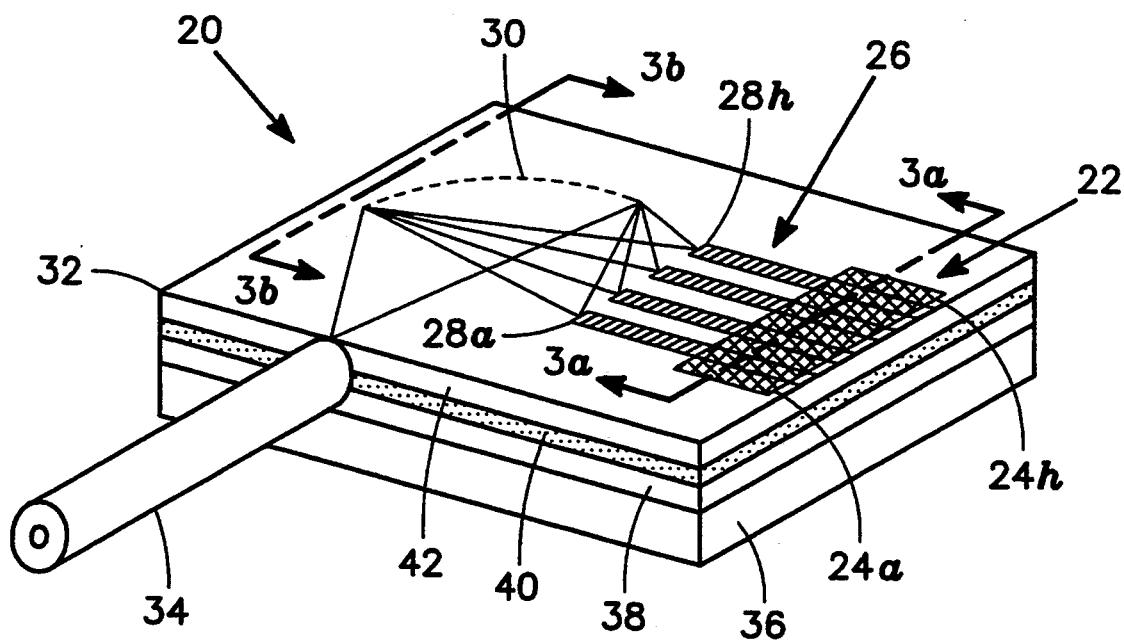
FIG. 1 is a diagram of an integrated circuit embodying a VDG WDM transmitter/multiplexer of the invention.

Referring to FIG. 1, an optical integrated circuit 20 embodying a multiplexer/transmitter of the invention includes a p-i-n quantum well structure 22 providing an array of semiconductor diode lasers 24a through 24h, an array 26 of surface gratings 28a through 28h facing respective ones of the lasers 24a through 24h, a curved VDG 30 and a vertical facet 32 coupled to a single optical fiber 34. The lasers 24a through 24h generate a corresponding set of laser beams of a linear progression of wavelengths determined by the different spacings of the surface gratings 28a through 28h. Specifically, the grating spacing of the surface grating 28a determines the wavelength of the laser 24a, the grating spacing of the surface grating 28 determines the wavelength of the laser 24b, and so forth. FIG. 1 illustrates only four of the eight lasers 24a through 24h and only four of the eight surface gratings 28a through 28h for the sake of simplicity and clarity. In practise, the actual number of lasers 24 may be selected by the skilled worker to be greater or less than the number discussed here (eight). Each of the lasers 24 of FIG. 1 has a single optical port at the end of its surface grating 28 facing the VDG 30.

The spacing of the successive grating points of the VDG 30 is "chirped" (varied as a function of location) so that the different wavelength beams from different ones of the lasers 24a through 24h are diffracted by the VDG 30 to the center of the single optical fiber 34 at its termination on vertical facet 32 without requiring any discrete components such as lenses or the like. This is accomplished by the linear progression of wavelengths of the lasers 24a through 24h, the uniform spacing between the lasers and the chirping of the grating spacing in the VDG 30, as will be described in greater detail below herein.

The integrated circuit 20, as will be described in greater detail below herein, constitutes a III–IV compound substrate layer 36 of GaAs, for example, a one micron thick lower cladding layer 38 of AlGaAs, for example, a 0.5 micron thick waveguide layer 40 of AlGaAs, for example, and a one micron thick upper cladding layer 42 of AlGaAs, for example. However, it should be understood that other layer structures based on AlGaAs or InGaAsP families may be employed by the skilled worker to implement the present invention. The center of the single optical fiber 34 terminating at the vertical facet 32 coincides with the vertical center of the waveguide layer 40. The VDG 30, the surface gratings 28a through 28h and the quantum well 22 including the lasers 24a through 24h are all formed in the waveguide layer 40.

Figure 2:
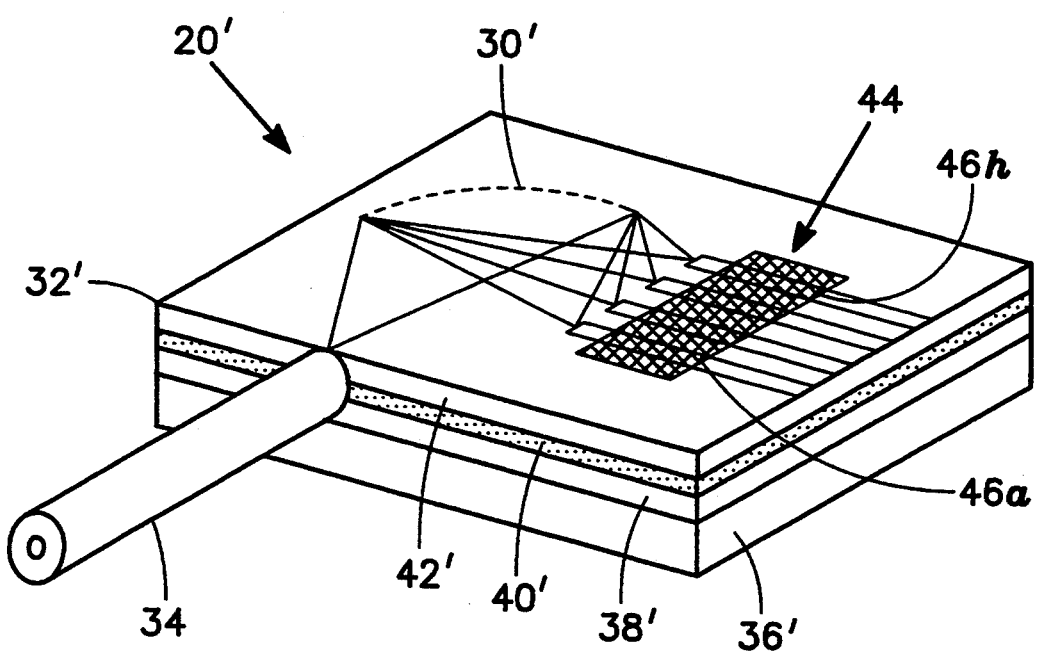
FIG. 2 is a diagram of an integrated circuit embodying a VDG WDM receiver/demultiplexer of the invention.

Referring to FIG. 2, an optical integrated circuit 20' embodying a receiver/demultiplexer has the same structure as the integrated circuit 20' of FIG. 1, except that the quantum well 22, the lasers 24a through 24h and the surface gratings 28a through 28h are replaced by a p-i-n quantum well structure 44 including photodetector diodes 46a through 46h. The locations of the photodetector diodes 46a through 46h correspond to the locations of the surface gratings 28a through 28h of FIG. 1. The demultiplexer integrated circuit 20' of FIG. 2 includes a VDG 30' identical to the VDG 30 of FIG. 1, a vertical facet 32' connected to the opposite end of the optical fiber 34, a substrate 36', a lower cladding layer 38', a waveguide layer 40' and an upper cladding layer 42'. The VDG 30', and the quantum well structure 44 including the photodetector diodes 46a through 46h are located in the waveguide layer 40'. FIG. 2 illustrates only four of the eight photodetector diodes 46a through 46h for the sake of simplicity and clarity of illustration. The number of diodes 46a through 46h should be the same as the number of lasers 24a through 24h on the multiplexer chip 20 of FIG. 1. Each of the photodetector diodes 46 of FIG. 2 has an optical port facing the VDG 30' where the drawing shows light beams from the VDG 30' converging at each diode 46.

Figure 3A:
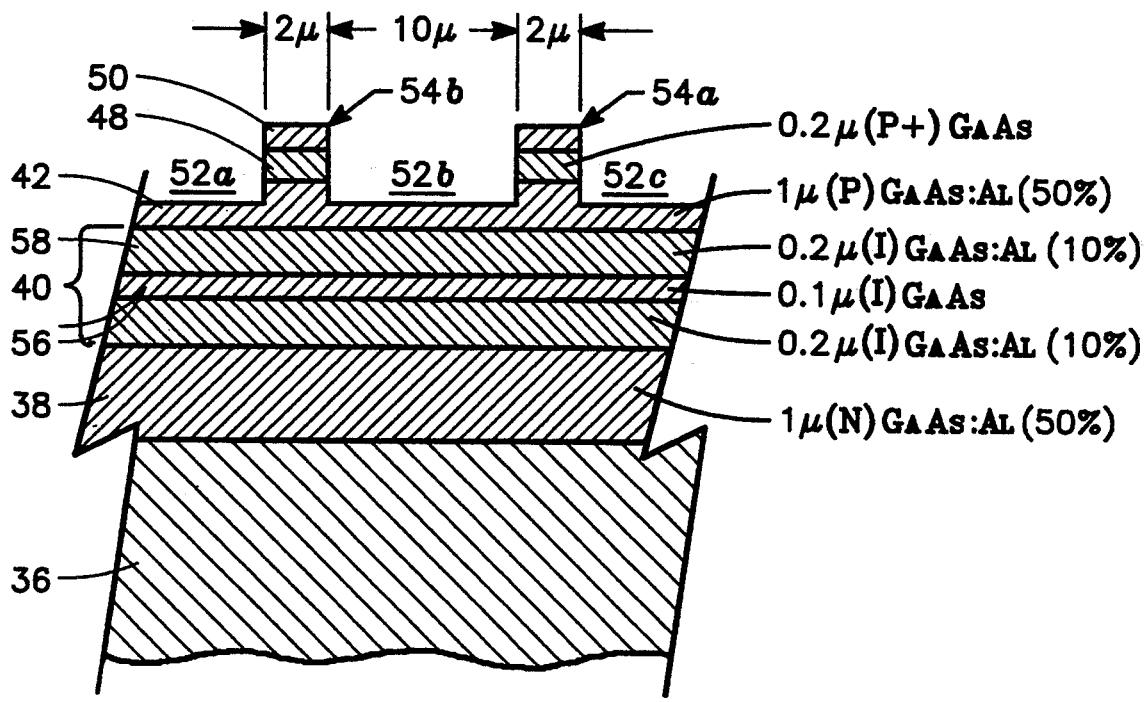
FIG. 3a is a cross-sectional view of a portion of the integrated circuit of FIG. 1 including a quantum well structure.
Figure 3B:
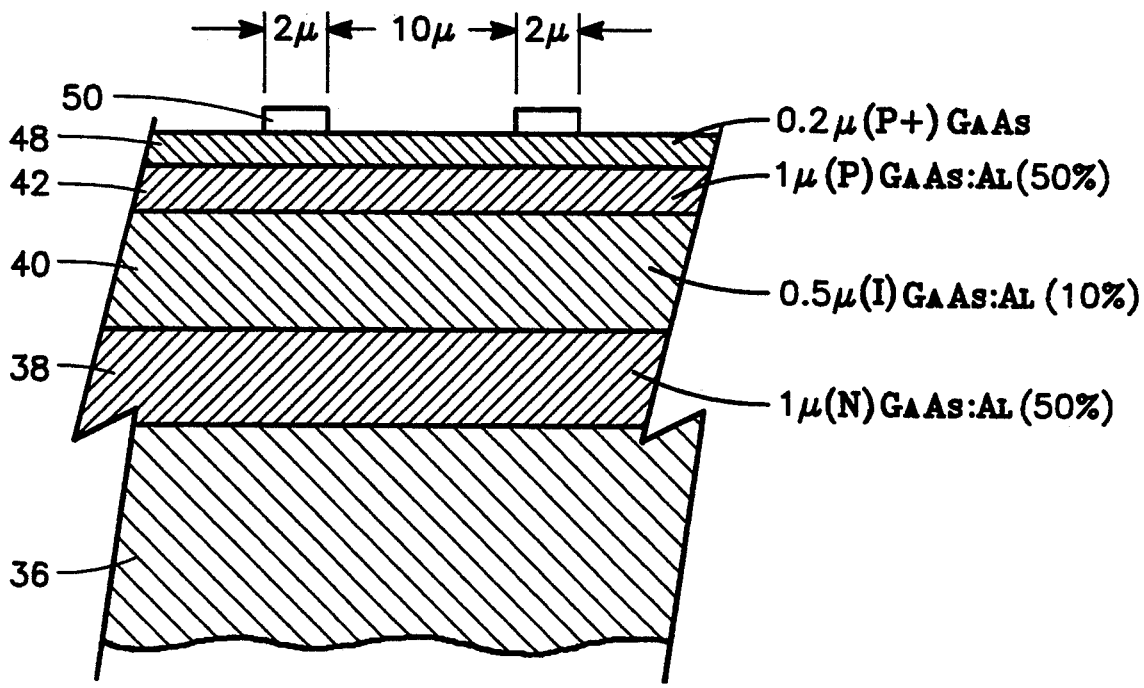
FIG. 3b is a cross-sectional view of another portion of the integrated circuit of FIG. 1 not including a quantum well structure.

The semiconductor structure in the vicinity of the quantum well 22 of FIG. 1 is illustrated in the partial cross-sectional view of FIG. 3a while the corresponding structure outside of the quantum well 22 is illustrated in the partial cross-sectional view of FIG. 3b. Referring now to FIGS. 3a and 3b, a 0.2 micron thick P+ GaAs layer 48 overlies the upper cladding layer 42. Individual laser-electrodes 50 overlie the P+ GaAs layer 48.

The substrate 36 is selected from a number of III–IV compound semiconductors. If GaAs is selected, then the upper and lower cladding layers 42, 38 are preferably GaAs:Al of 50% Al, the upper cladding layer 42 being p-doped and the lower cladding layer 38 being n-doped. Outside of the quantum well 22 (FIG. 3b), the waveguide layer 40 is intrinsic GaAs:Al of 10% Al. The p-i-n quantum well 22 (FIG. 3a) is formed by etching away all but about 0.2 microns of the waveguide layer 40—only in the region of the quantum well 22 to be formed—and then growing a 0.1 micron thick epitaxial active layer 56 of pure intrinsic GaAs in that region. An intrinsic 0.2 micron thick GaAs:Al layer 58 of 10% Al is deposited over the epitaxial GaAs layer 56 to complete the waveguide layer 40 in that region, and the overlying layers 42, 48 and 50 are formed thereover.

Individual lasers in the array of lasers 24a through 24h of FIG. 1 are those portions of the active layer 56 underlying corresponding ones of the electrodes 50 and are separated by 10 micron-wide channels 52a, 52b, 52c, etc., etched through the metal layer 50, the P+ GaAs layer 48 and through most of the upper cladding layer 42. Each individual laser 24a, 24b, etc. lies under a corresponding one of the 2 micron-wide ridges 54a, 54b, etc. formed between the channels 52, 52b, 52c, etc.

The lasers 24a through 24h are operated in accordance with conventional techniques by imposing a D.C. bias voltage on each of the laser electrodes 50 and applying to each electrode 50 a different A.C. signal representing a corresponding channel to be multiplexed on the output optical fiber 34.

The semiconductor structure of the quantum well 44 of the photodetector diodes 46a through 46h of the demultiplexer of FIG. 2 is the same as that of the quantum well 22 of FIG. 3a, except that the quantum well 46 is located differently as shown in FIG. 2. Specifically, the point of incidence of the diffracted light on each of the photodetector diodes 46a through 46h of FIG. 2 (i.e., the "detector optical port") corresponds to the point of exit of light from each of the surface gratings 28a through 28h, respectively, of FIG. 1 (i.e., the "laser optical port").

Figure 4:
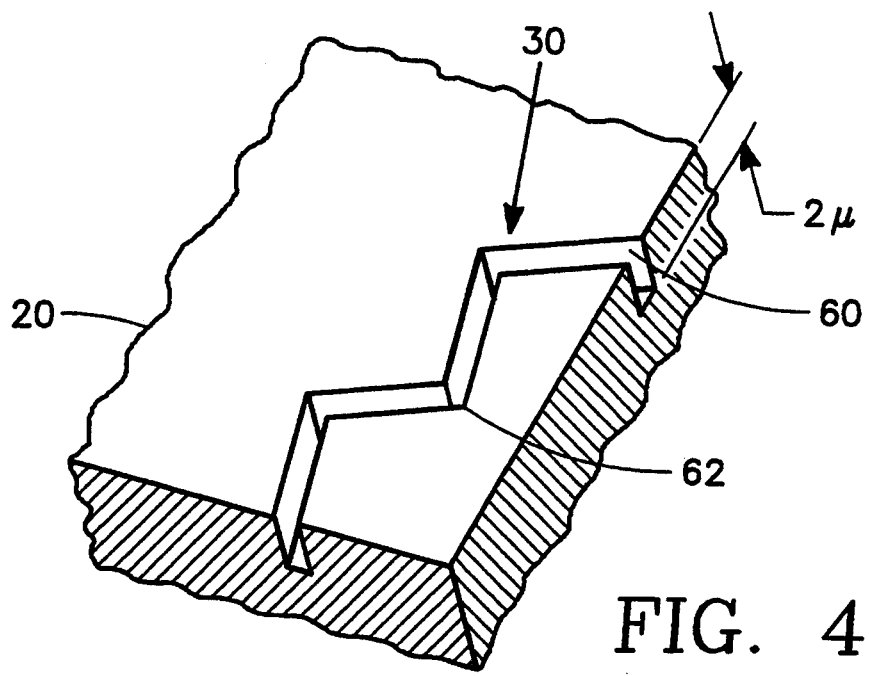
FIG. 4 is an enlarged view of a portion of the VDG employed in the circuits of FIGS. 1 and 2.

Referring to FIG. 4, the VDG 30 is formed using electron beam lithography by etching a 2 micron-deep narrow channel 60 in a saw-tooth pattern along the arcuate concave contour (FIG. 1) of the VDG 30. The saw-tooth pattern forms many "teeth" 62, each of which is one grating point of the VDG 30.

The position of the diffraction grating points ("teeth") 62 along the contour of the VDG 30 is chosen in such a manner that each pair of grating points 62 diffracts light beams of two predetermined wavelengths $\lambda_1$ and $\lambda_2$, emanating from points $P_1$ and $P_2$, respectively, along the Y-axis (corresponding to two of the diode lasers 24 of FIG. 1) to the same point Q along the X-axis (corresponding to the termination of the optical fiber 34 at the facet 32 of FIG. 1).

If there are m grating points 62 in the VDG 30, n is the effective index of waveguide mode in the waveguide layer 40 and M is the order of the diffraction grating, then the locations $R_i$ in the X-Y plane of FIG. 5 of the $i^{th}$ one of the m grating points 62 for $1 \leq i \leq m$ is determined by solving the m pairs of equations (1) (2) given below in the manner prescribed below.

Figure 5:
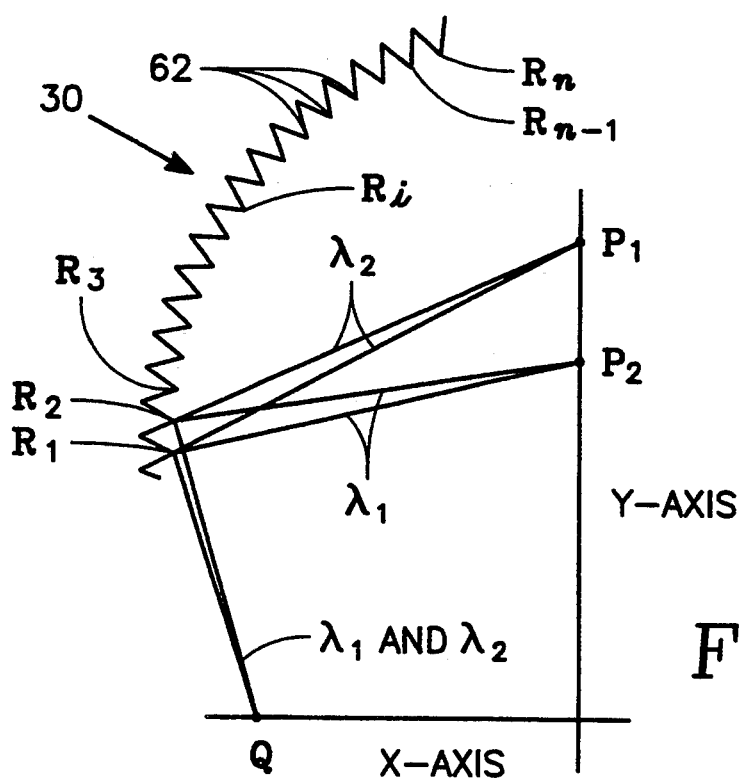
FIG. 5 is a diagram illustrating the design and operation of the VDG of FIG. 4.

$P_1$ denotes a vector of position in the X-Y plane of FIG. 5 whose coordinates are $P_{1x}$ and $P_{1y}$. $P_2$ denotes a vector of position in the X-Y plane of FIG. 5 whose coordinates are $P_{2x}$ and $P_{2y}$. Q denotes a vector of position in the X-Y plane of FIG. 5 whose coordinates are $Q_x$ and $Q_y$. $R_i$ denotes a vector of position in the X-Y plane of FIG. 5 whose coordinates are $R_{i,x}$ and $R_{i,y}$, for each value of i in the interval $1 \leq i \leq m$.

The initial values of $R_{i,x}$ and $R_{i,y}$ may be chosen for arbitrarily. Then, the following two equations are solved:

$$[|R_{i+1}-Q|+|R_{i+1}-P_1|]-[|R_{i+1}-Q|+|R_i-P_1|]=M\lambda_1/n \quad (1)$$

$$[|R_{i+1}-Q|+|R_{i+1}-P_2|]-[|R_i-Q|+|R_i-P_2|]=M\lambda_2/n \quad (2)$$

In Equations (1) and (2), the notation $|A-B|$, in which A and B are any two vector quantities, indicates the distance between A and B, which is given by $$|A-B|=[(A_x-B_x)^2+(A_y-B_y)^2]^{\frac{1}{2}}. \quad (3)$$

Equations (1) and (2) are solved simultaneously for the quantities $R_{i,x}$ and $R_{i,y}$ for each value of i in the interval $2 \leq i \leq m$ sequentially. The values of $R_{1x}$ and $R_{1y}$ are chosen initially, and Equations (1) and (2) are solved with i=1 for $R_{2x}$ and $R_{2y}$. Then Equations (1) and (2) are solved with i=2 for $R_{3x}$ and $R_{3y}$. This process continues sequentially with increasing i until all values of $R_{i,x}$ and $R_{i,y}$ have been found.

Figure 6:
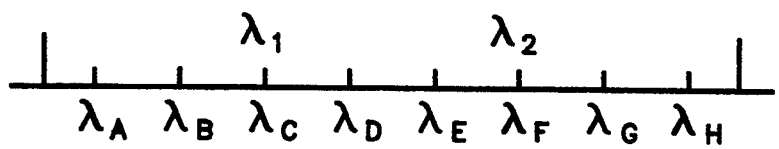
FIG. 6 is a diagram illustrating the selection of a pair of wavelengths defining the diffraction grating spacing of the VDG of FIG. 4 relative to a range of wavelengths in which the VDG is to operate.

As illustrated in FIG. 6, $\lambda_1$ and $\lambda_2$ are preferably selected to span a major intermediate portion of the wavelength range spanned by the sequence of wavelengths $\lambda_a$ through $\lambda_h$ of the array of lasers 24a through 24h. In order to take advantage of the bandwidth of the optical fiber 34, the sequence of wavelengths $\lambda_a$ through $\lambda_h$ should span a range centered at 1.3 or 1.55 microns.

Equations (1) and (2) define both the arcuate contour along which the diffraction grating points 62 of the VDG 30 lie as well as their placement and linear density along the arcuate contour. The arcuate contour is general concave relative to the diode array and the optical fiber 34. In summary, Equations (1) and (2) require that the locations and frequencies of the output optical ports of the lasers 24 (FIG. 1) or the input optical ports of the photodetector diodes 44 (FIG. 2) be uniformly spaced along a straight line, and that the lasers 24 be tuned by their respective surface gratings 28 to a linear succession of wavelengths symmetrically straddling the wavelength region spanned by the two selected wavelengths $\lambda_1$ and $\lambda_2$.

Figure 7:
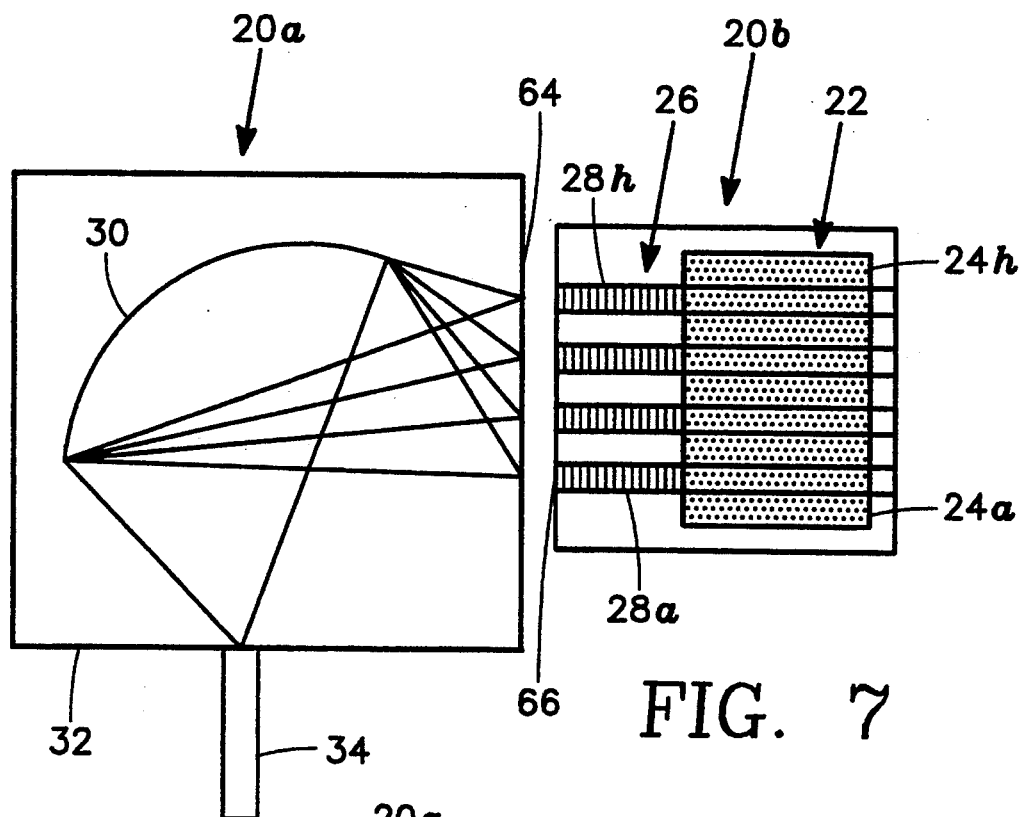
FIG. 7 is a diagram of a first alternative embodiment of the invention in which the VDG and the laser or detector array are located on separate integrated circuits.

Referring to FIG. 7, the integrated circuit 20 of FIG. 1 may be divided into two integrated circuits 20a, 20b fabricated separately. The first integrated circuit or chip 20 includes the VDG 30 and the vertical facet 32 connected to the optical fiber 34. The second integrated circuit 20b includes the quantum well 22 with the lasers 24a through 24h and the array 26 of surface gratings 28a through 28h. Vertical facets 64 and 66 of the integrated circuits 20a, 20b face one another and are butted together, although FIG. 7 shows them spaced slightly away from one another for the sake of clarity. Once butted together, the pair of integrated circuits 20a, 20b of FIG. 7 provide optical paths the same as the integrated circuit of FIG. 1. The facets 64 and 66 may be thought of (for tutorial purposes) as being defined by cutting or dividing the integrated circuit or chip 20 of FIG. 1 into two chips along a straight line extending along the output ends of the surface gratings 28a through 28h.

The advantage of constructing the WDM VDG multiplexer of the invention as the pair of integrated circuits 20a, 20b of FIG. 7 is that the semiconductor processing sequence for fabricating the second integrated circuit 20b may be customized for forming the quantum well 22 (FIG. 3a), thereby eliminating the necessity of any removal and regrowth steps to form the intrinsic GaAs layer 56 of FIG. 3.

Figure 8:
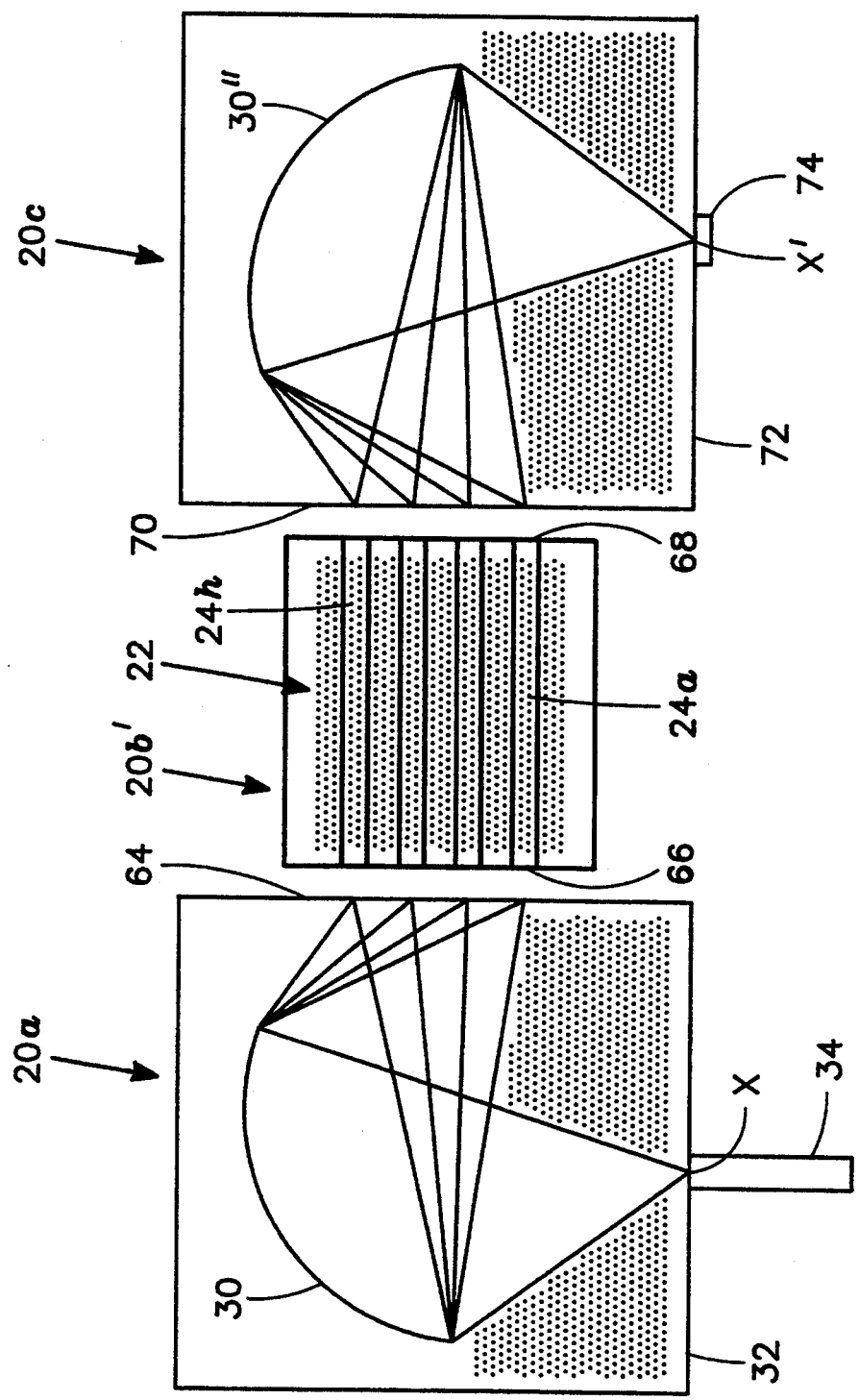
FIG. 8 is diagram of a second alternative embodiment of the invention in which the laser array of the transmitter is sandwiched between two mirror-image VDG's.

Referring to FIG. 8, the surface grating array 26 of FIG. 7 is eliminated. Tuning of the lasers 24a through 24h to the required sequence of wavelengths is provided instead by butt-coupling a vertical facet 70 of a third integrated circuit 20c containing a second VDG 30" to the opposite facet 68 of a second integrated circuit 20b' containing the array of lasers 24a through 24h. The second integrated circuit 20b' of FIG. 8 is like the second integrated circuit 20b of FIG. 7 except for the absence of the surface grating array 26. Moreover, the opposing facets 66, 68 of the second integrated circuit 20b' of FIG. 8 at at the two ends of the laser gain regions of all of the lasers 24a through 24h. While the array of lasers 24a through 24h of FIGS. 1 and 7 emit light only at their ends facing the surface grating array 26, the lasers of FIG. 8 emit light at both ends, thus illuminating both VDG's 30, 30". For this reason, the pair of VDG's 30, 30" define different laser cavity lengths for each one of the individual lasers 24a through 24h corresponding precisely to the desired sequence of wavelengths. The second VDG 30" is an exact mirror image of the VDG 30. While the first VDG 30 diffracts all the laser beams to a single point X centered at the termination of the optical fiber 34 on the vertical facet 32, the second VDG diffracts all the laser beams it receives to a single point X' on a vertical facet 72 of the third integrated circuit 20c at which a highly reflective coating 74 is deposited.

All optical paths between the two VDG's 30, 30" in FIG. 8 are bi-directional so that each laser 24a through 24h has a different laser cavity length corresponding to an optical path between the point X on the vertical facet 34 and the point X' at the vertical facet 72. As in the drawing of FIG. 7, the three integrated circuits of FIG. 8 are illustrated with a slight separation therebetween for the sake of clarity, although it is understood that they actually touch or are butt-coupled at the pairs of adjacent facets 64, 66 and 68, 70 respectively.

The advantage of the embodiment of FIG. 8 over that of FIG. 7 is that the lasers 24a through 24h are precisely tuned by simply providing mirror-image VDG's 30, 30", eliminating the necessity of providing surface gratings 26 which must be carefully etched to the sequence of wavelengths corresponding to the geometry of the VDG 30. It is therefore felt that the task of tuning the lasers 24a through 24h is easier in the embodiment of FIG. 8. While the embodiment of FIG. 8 enjoys the advantage of the embodiment of FIG. 7 of being formed in separate integrated circuits to avoid removal and regrowth steps in the fabrication of the quantum well 22, the embodiment of FIG. 8 may instead be formed on a single integrated circuit if desired.

Figure 9:
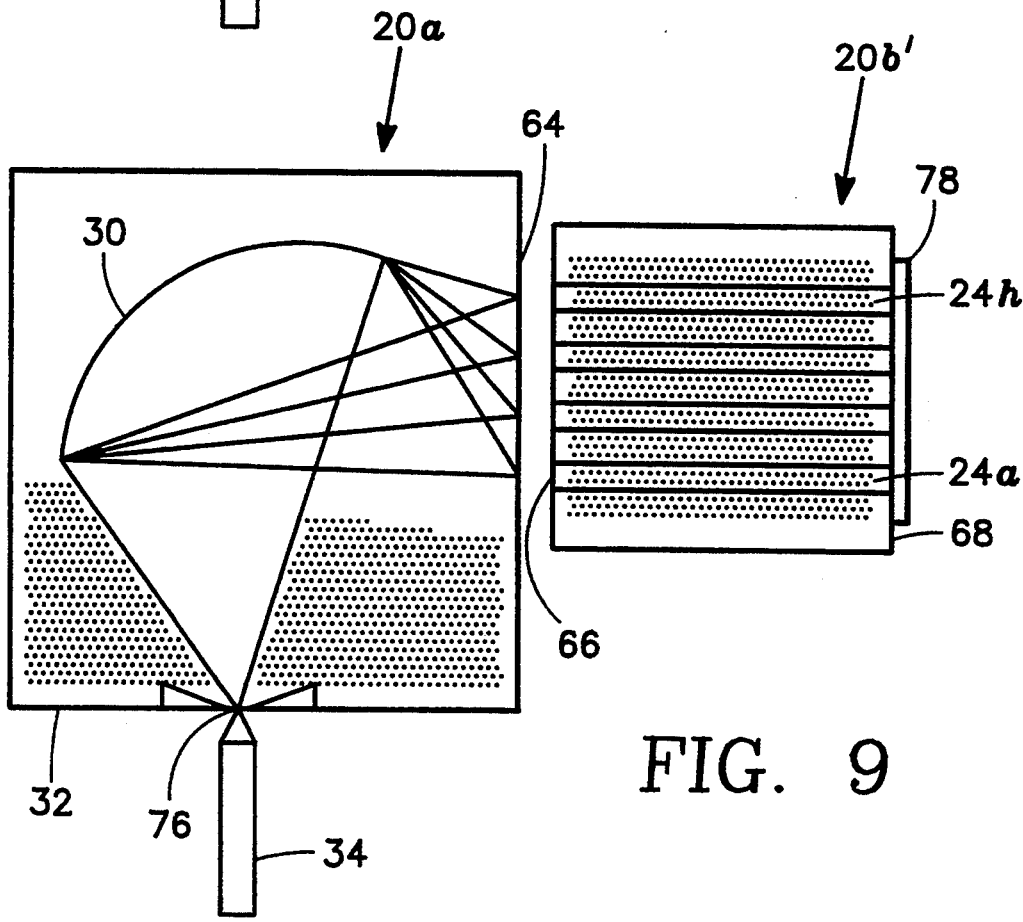
FIG. 9 is a diagram of a third alternative embodiment of the invention employing an etched spatial filter for determining the sequence of wavelengths of the laser array.

Referring to FIG. 9, the embodiment of FIG. 8 is simplified by eliminating the third integrated circuit 20c and instead providing a etched spatial filter 76 at the interface between the termination of the optical fiber 34 and the vertical facet 32. Using techniques well-known in the art, the spatial pattern of the etched spatial filter 76 is determined in a straight-forward manner from the desired sequence of wavelengths described above herein. In the embodiment of FIG. 9, the lasers 24a through 24h emit light only at their ends facing the VDG 30 (like the embodiments of FIGS. 1 and 7). For this purpose, a highly reflective coating 78 is deposited on the vertical facet 68. Like the embodiment of FIG. 8, the embodiment of FIG. 9 may be realized as the pair of separate integrated circuits 20a, 20b' shown in the drawing of FIG. 9 or combined on a single integrated circuit.

Figure 10:
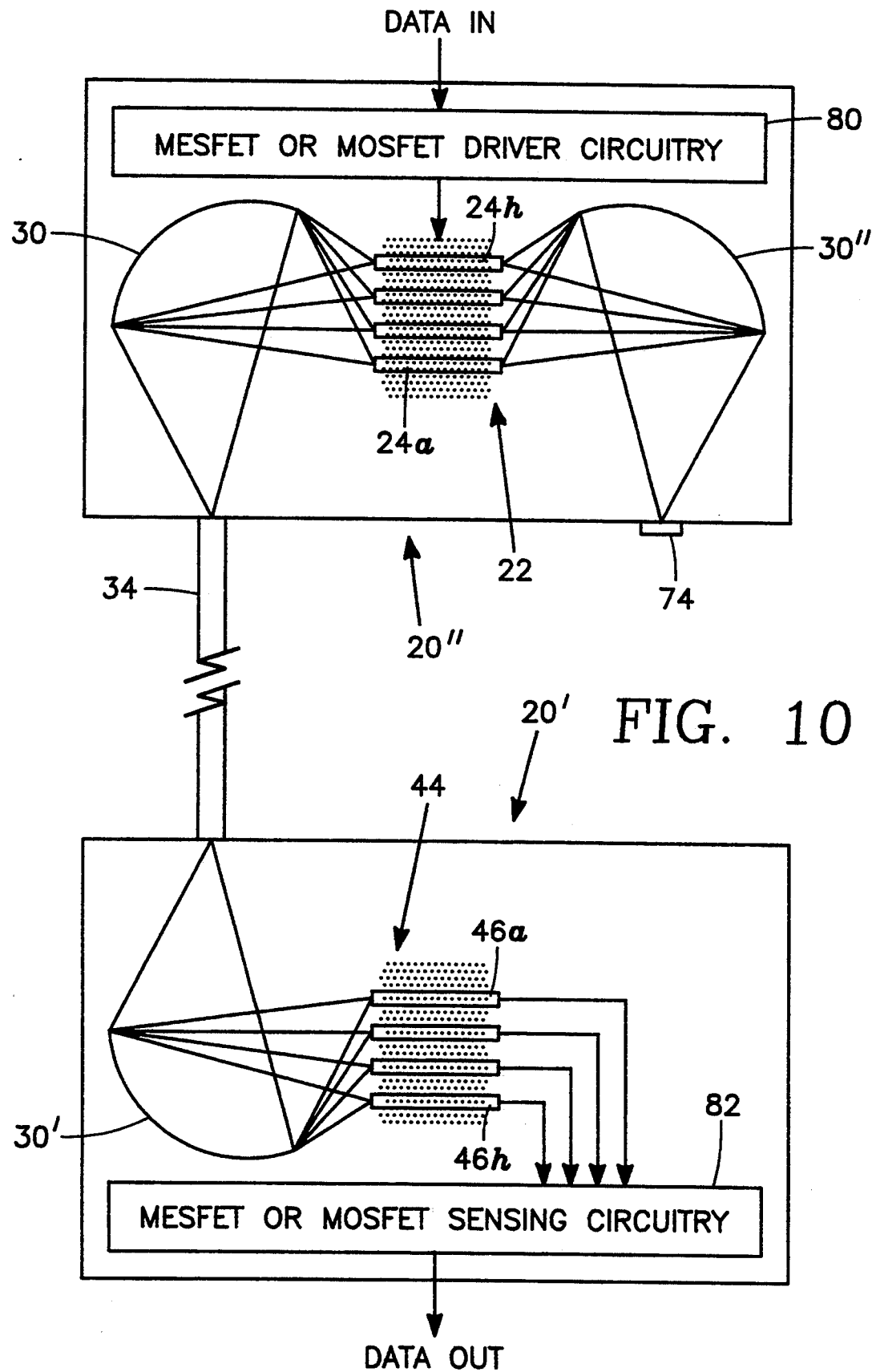
FIG. 10 is a simplified block diagram of an optical communication system embodying the invention.

FIG. 10 illustrates a complete system in which a transmitter/multiplexer corresponding to the embodiment of FIG. 8 realized in a single integrated circuit 20" is connected through the optical fiber 34 to a receiver/demultiplexer integrated circuit 20' of the embodiment of FIG. 2. As shown in FIG. 10, the multiplexer integrated circuit 20" includes conventional MESFET or MOSFET driver circuitry 80 controlling the lasers 24a through 24h in response to input data (DATA IN). The demultiplexer integrated circuit 20' of FIG. 10 includes conventional MESFET or MOSFET sensor circuitry 82 connected to the photodetector diodes 46a through 46h which generates output data (DATA OUT) from the responses of the photodetector diodes to light received via the optical fiber 34.

Figure 11:
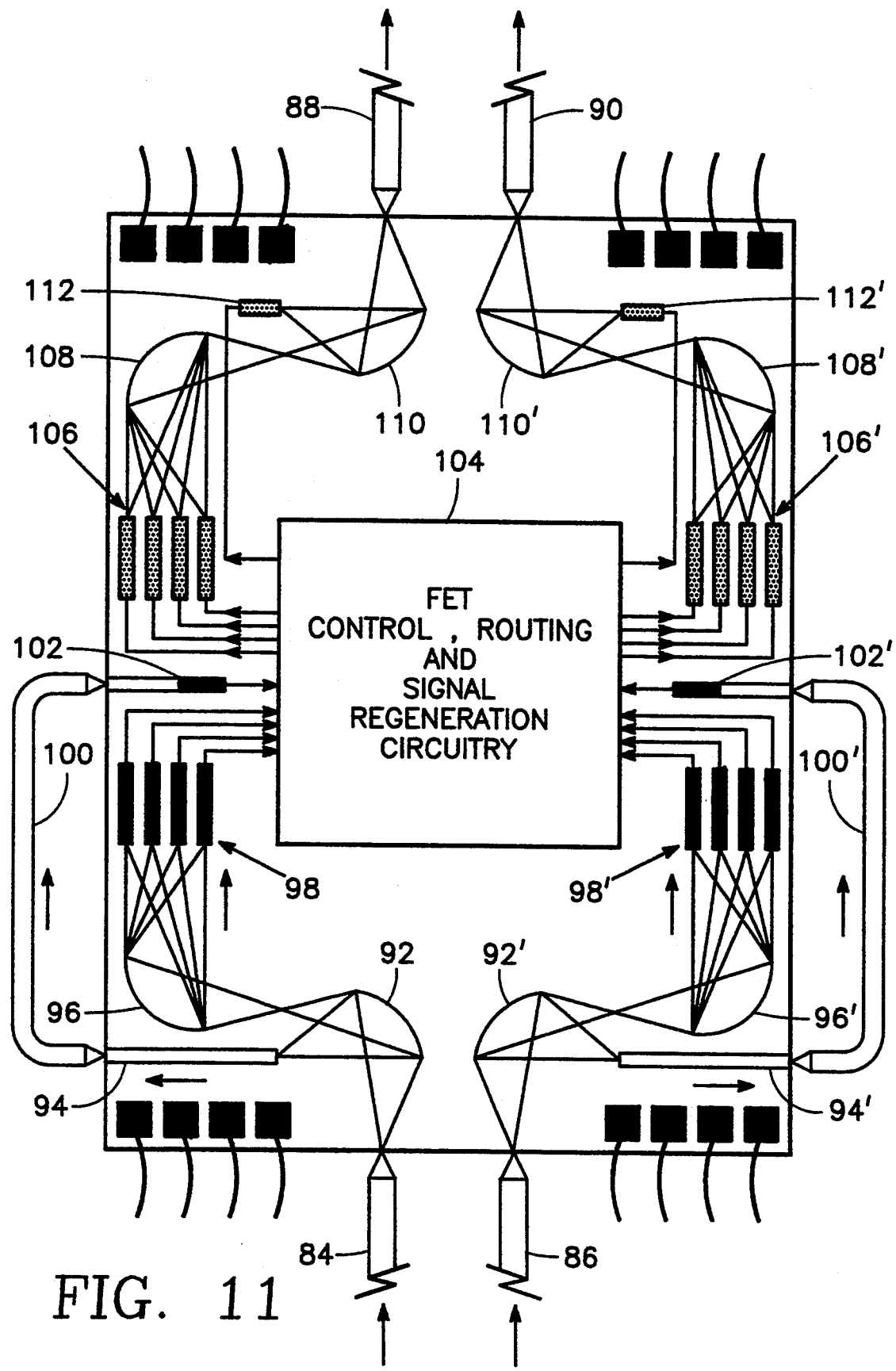
FIG. 11 is a system diagram of a multiplexing/demultiplexing node employing the invention in a fiber-optic communication network.

Referring to FIG. 11, an optical switching node embodying the present invention and compatible with the architecture of the proposed NTF optical communication network referred to previously herein is formed on a single integrated circuit as illustrated. In the proposed NTF optical communication network, the various multiplexed channels are divided into two general wavelength bands, namely a band at 1.55 microns carrying a data channel and plural information channels near a 1.3 micron band. The integrated circuit of FIG. 11 is connected at one vertical facet to two incoming optical fibers 84, 86 and at an opposite vertical facet to two outgoing optical fibers 88, 90. Each optical fiber 84, 86, 88, 90 carries a separate group of multiplexed channels of the network, the integrated circuit of FIG. 11 receiving multiplexed signals on the incoming optical fibers 84, 86 and the transmitting multiplexed signals on the outgoing optical fibers 88, 90. The integrated circuit of FIG. 11 functions as a node in the network because it can route signals received on any multiplexed channel of either of the two incoming fibers 84, 86 to any multiplexed channel of either one of the two outgoing fibers 88, 90.

The integrated circuit of FIG. 11 has the same semiconductor structure as the multiplexer and demultiplexer integrated circuits of FIGS. 1 and 2, as described previously herein in detail with reference to FIGS. 3a and 3b, and elements of the multiplexer and demultiplexer integrated circuits of FIGS. 1 and 2 are repeated and distributed about the integrated circuit of FIG. 11, as will now be described.

A first VDG 92 (of the type described above with reference to FIGS. 1, 4, 5 and 6) is a wide-band VDG and diffracts the 1.55 micron data band to an optical waveguide 94 and diffracts the information band near 1.3 microns containing the plural information channels to a narrow-band VDG 96. The narrow-band VDG 96 diffracts each one of the information channels to an individual one of an array of photodetector diodes 98.

The waveguide 94 couples the data band through a delay-line optical fiber 100 to a photodetector diode 102. The outputs of all of the photodetector diodes 98, 102 are connected to an electronic input of conventional FET control, routing and signal regeneration circuitry 104. The data and information signals received via the incoming optical fiber 86 are likewise coupled to other electronic inputs of the FET control circuitry 104 through corresponding VDG's 92', 96', photodetector diodes 98', 102' and delay line 100'.

The FET control circuitry 104 controls a laser array 106 including individual diode lasers and surface gratings (corresponding to the laser-surface grating pairs 24, 28 of FIG. 1) tuned to the separate information wavelength near 1.3 microns as referred to above. The light beams from the laser array 106 are diffracted by a narrow-band VDG 108 (corresponding to the narrow-band VDG 96) to a broad-band VDG 110 (corresponding to the broad-band VDG 92). The FET control circuitry 104 also controls the output of a diode laser 112 tuned by a surface grating to 1.55 microns. The broad-band VDG 110 diffracts the light from the narrow-band VDG 108 and from the 1.55 micron laser 112 to the output optical fiber 88. The FET control circuitry 104 routes data it has received at 1.55 microns from either of the two input fibers 84, 86 to the 1.55 micron laser 112 for transmission on the outgoing fiber 88. The FET control circuitry 104 routes information it has received on any of the information bands near 1.3 microns from either one of the incoming optical fibers 84, 86 to corresponding ones of the lasers in the array 106 for transmission on the optical fiber 88.

The FET control circuitry 104 has other electronic outputs coupled in like manner to the outgoing fiber 90 via a 1.33 micron laser array 106', a 1.5 micron laser 112, a narrow-band VDG 108' and a broad-band VDG 110'. The FET control circuitry 104 routes data it has received at 1.55 microns from either of the two input fibers 84, 86 to the 1.55 micron laser 112' for transmission on the outgoing fiber 90. The FET control circuitry 104 routes information it has received on any of the information bands near 1.3 microns from either one of the incoming optical fibers 84, 86 to corresponding ones of the lasers in the array 106' for transmission on the optical fiber 90.

A lateral optical waveguide boundary may be formed in the waveguide layer by ion implanting impurities in the waveguide laser in a region surrounding the desired V-shaped optical path between the terminated end of the optical fiber 34 and the vertical diffraction grating 30. Such an implanted region is the shaded region of the integrated circuit 20a in FIG. 8 and in FIG. 9 and also the shaded region of the integrated circuit 20c in FIG. 8.

Thus, it should be apparent from the foregoing that the invention includes a number of variations and different embodiments which the skilled worker may readily implement.

While the invention has been described in detail with reference to a preferred embodiment implemented in GaAs, other structures may be employed by the skilled worker to implement the invention, including such compound semiconductor families as AlGaAs or InGaAsP.

While the invention has been described in detailed by specific reference to preferred embodiments, it is understood that variations and modifications thereof may be made without departing from the true spirit and scope of the invention.

What is claimed is:

1. A semiconductor optical integrated circuit having a semiconductor waveguide layer for wave division multiplexing or demultiplexing, comprising:
   a succession of diffraction grating points in said waveguide layer along a predetermined diffraction grating contour;
   a semiconductor diode array in said waveguide layer near plural optical ports facing said succession of diffraction grating points along a first direction, respective semiconductor diodes in said array corresponding to respective ones of a predetermined succession of wavelengths;
   an optical fiber having one end thereof terminated at said waveguide layer, said one end of said optical fiber facing said succession of diffraction grating points along a second direction; and
   wherein said diffraction grating points are spatially distributed along said predetermined contour in such a manner that said succession of diffraction grating points diffracts light of respective ones of said succession of wavelengths between said one end of said optical fiber and corresponding ones of said optical ports.

2. The integrated circuit of claim 1 wherein said first and second directions are generally perpendicular with respect to each other.

3. The integrated circuit of claim 1 wherein said array of semiconductor diodes comprises diode lasers which transmit light of respective ones of said succession of wavelengths to said one end of said optical fiber via said succession of diffraction grating points, said integrated circuit performing wave division multiplexing.

4. The integrated circuit of claim 3 further comprising:
   means for tuning respective ones of said diode lasers to respective ones of said succession of wavelengths.

5. The integrated circuit of claim 4 wherein said means for tuning comprises individual surface gratings in said waveguide layer disposed between respective diode lasers and respective ones of said optical ports, said individual surface gratings having respective grating spacings corresponding to respective ones of said succession of wavelengths.

6. The integrated circuit of claim 4 wherein said optical ports face one end of said array of semiconductor diodes, said array of semiconductor diodes having second optical ports at an opposite end thereof, and wherein said means for tuning comprises:
   a second succession of diffraction grating points disposed along a second predetermined contour in said waveguide layer and facing said second optical ports along a third direction and a reflective surface facing said second succession of diffraction grating points along a fourth direction, said second succession of diffraction grating points being spatially distributed along said second predetermined contour in such a manner that said second succession of diffraction grating points diffracts light of respective ones of said succession of wavelengths between said reflective surface and corresponding ones of said second optical ports.

7. The integrated circuit of claim 1 wherein said diode array comprises respective semiconductor photodetector diodes which receive light of respective ones of said succession of wavelengths from said optical fiber via said succession of diffraction grating points, whereby said integrated circuit performs wave division demultiplexing.

8. The integrated circuit of claim 7 further comprising electronic circuit means for generating electrical signals in response to light received by said semiconductor photodetector diodes, said electrical signals comprising plural channels demultiplexed from a multiplexed signal received via said optical fiber.

9. The integrated circuit of claim 3 further comprising electronic circuit means for controlling said diode lasers in response to electrical signals representing plural channels to be multiplexed together for transmission in said optical fiber.

10. The integrated circuit of claim 1 wherein said sequence of diffraction grating points in said waveguide layer are comprised in a narrow shallow sawtooth shaped channel etched in said waveguide layer along said predetermined contour, said diffraction grating points comprising corners of said sawtooth shaped channel.

11. The integrated circuit of claim 1 wherein said distribution of said diffraction grating points along said predetermined contour corresponds to a pair of wavelengths spanning a major portion of said succession of wavelengths and corresponding to a pair of locations along said optical ports, wherein each pair of adjacent ones of said diffraction grating points diffracts light of each of said pair of wavelengths between said optical fiber and a corresponding one of said pair of locations along said optical ports.

12. The integrated circuit of claim 1 further comprising a p-i-n quantum well in said waveguide layer in which said semiconductor diodes are formed.

13. The integrated circuit of claim 12 wherein said integrated circuit comprises at least a pair of integrated circuits butt-coupled together at adjacent vertical facets thereof, a first one of said pair of integrated circuits having said p-i-n quantum well with said semiconductor diodes and the other having said diffraction grating points and coupled to said optical fiber.

14. The integrated circuit of claim 6 wherein said integrated circuit comprises three integrated circuits butt-coupled together at adjacent vertical facets thereof, an intermediate one of said three integrated circuits sandwiched between the other two and having said diode lasers, and said other two integrated circuits having respective ones of the first and second succession of diffraction grating points, said intermediate integrated circuit comprising a p-i-n quantum well in the waveguide layer thereof in which said diode lasers are formed.

15. The integrated circuit of claim 4 wherein said means for tuning comprises an etched spatial filter in said waveguide layer near said one end of said optical fiber.

16. The integrated circuit of claim 1 wherein said predetermined contour comprises an arc concave relative to said optical ports and wherein the spatial distribution of said diffraction grating points along said arc varies as a function of location.

17. A wave division multiplexed optical communication system comprising:
   (A) a transmitter multiplexer integrated circuit having a first semiconductor waveguide layer, comprising:
      (1) a succession of first diffraction grating points in said first waveguide layer along a first diffraction grating contour, (2) a diode laser array in said first waveguide layer near plural laser optical ports facing said succession of first diffraction grating points along a first direction, respective diode lasers in said array corresponding to respective ones of a predetermined succession of wavelengths, (3) an optical fiber having one end thereof terminated at said first waveguide layer, said one end of said optical fiber facing said succession of first diffraction grating points along a second direction, (4) wherein said diffraction grating points are spatially distributed along said first contour in such a manner as to diffract light of respective ones of said succession of wavelengths between said one end of said optical fiber and corresponding ones of said laser optical ports;

(B) a receiver demultiplexer integrated circuit having a second semiconductor waveguide layer, comprising:

(1) a succession of second diffraction grating points in said second waveguide layer along a second diffraction grating contour, (2) a photodetector diode array in said second waveguide layer having plural detector optical ports facing said succession of diffraction grating points along a third direction, respective photodetector diodes in said array corresponding to respective ones of said predetermined succession of wavelengths, (3) another end of said optical fiber being terminated at said second waveguide layer, said other end of said optical fiber facing said succession of diffraction grating points second succession along a fourth direction, (4) wherein said second diffraction grating points are spatially distributed along said second contour in such a manner as to diffract light of respective ones of said succession of wavelengths between said other end of said optical fiber and corresponding ones of said detector optical ports.

18. The system of claim 17 wherein said first and second directions are generally perpendicular with respect to each other and said third and fourth directions are generally perpendicular with respect to each other.

19. The system of claim 17 further comprising:
means for tuning respective ones of said diode lasers to respective ones of said succession of wavelengths.

20. The system of claim 19 wherein said means for tuning comprises individual surface gratings in said first waveguide layer disposed between active gain regions of respective diode lasers and respective ones of said laser optical ports, said individual surface gratings having respective grating spacings corresponding to respective ones of said succession of wavelengths.

21. The integrated circuit of claim 19 wherein said laser optical ports face one end of said array of diode lasers, said array of diode lasers having second laser optical ports at an opposite end thereof, and wherein said means for tuning comprises:
a third succession of diffraction grating points disposed along a third diffraction grating contour in said second waveguide layer and facing said second laser optical ports along a fifth direction and a reflective surface facing said third succession of diffraction grating points along a sixth direction, said third succession of diffraction grating points being spatially distributed along said third contour in such a manner as to diffract light of respective ones of said succession of wavelengths between said reflective surface and corresponding ones of said second laser optical ports.

22. The integrated circuit of claim 17 wherein said first and second successions of diffraction grating points in said first and second waveguide layers are comprised in respective narrow shallow sawtooth shaped channels etched in the respective waveguide layers along said predetermined contours, said diffraction grating points comprising corners of said sawtooth shaped channels.

23. The integrated circuit of claim 17 wherein said distribution of said diffraction grating points along said predetermined contours corresponds to a pair of wavelengths spanning a major portion of said succession of wavelengths and corresponding to a pair of locations along respective ones of said laser and detector optical ports, wherein each pair of adjacent ones of said diffraction grating points diffracts light of each of said pair of wavelengths between said optical fiber and a corresponding one of said pair of locations, the spatial distributions of the diffraction grating points in said first and second successions of grating points being identical.

24. The integrated circuit of claim 19 wherein said means for tuning comprises an etched spatial filter in said first waveguide layer near said one end of said optical fiber.

25. A switching node in an optical communication network, comprising:
a plurality of outgoing optical fibers and a plurality of incoming optical fibers;
a plurality of multiplexers formed on an integrated circuit having a waveguide layer, each of said multiplexers comprising:

(1) a succession of first diffraction grating points in said first waveguide layer along a first diffraction grating contour, (2) a diode laser array in said first waveguide layer near plural laser optical ports facing said succession of first diffraction grating points along a first direction, respective diode lasers in said array corresponding to respective ones of a predetermined succession of wavelengths, (3) one end of a corresponding one of said outgoing optical fibers being terminated at said first waveguide layer and facing said succession of first diffraction grating points along a second direction, (4) wherein said diffraction grating points are spatially distributed along said first contour in such a manner as to diffract light of respective ones of said succession of wavelengths between said one end of said optical fiber and corresponding ones of said laser optical ports;

a plurality of demultiplexers formed on an integrated circuit having a second waveguide layer, each of said demultiplexers comprising:

(1) a succession of second diffraction grating points in said second waveguide layer along a second diffraction grating contour, (2) a photodetector diode array in said second waveguide layer having plural detector optical ports facing said succession of diffraction grating points along a third direction, respective photodetector diodes in said array corresponding to respective ones of said predetermined succession of wavelengths, (3) one end of a corresponding one of said incoming optical fibers being terminated at said second waveguide layer and facing said second succession of diffraction grating points along a fourth direction, (4) wherein said second diffraction grating points are spatially distributed along said second contour in such a manner as to diffract light of respective ones of said succession of wavelengths between said other end of said optical fiber and corresponding ones of said detector optical ports; and control circuitry for sensing electronic signals from said photodetector diodes and for applying electronic control signals to said lasers in response to said electronic signals from said diodes.

26. The switching node of claim 25 wherein said control circuit comprises means for routing a signal received on a given one of said incoming optical fibers to a given one of said outgoing optical fibers.

27. The switching node of claim 25 wherein said first and second waveguide layers are one and the same layer in an integrated circuit whereby said multiplexer and said demultiplexer are formed together in the same waveguide layer of the same integrated circuit.

28. The switching node of claim 25 wherein each succession diffraction grating points comprises:

a wide-band vertical diffraction grating for transforming between (a) a multiplexed channel carried by a corresponding one of said optical fibers and (b) plural demultiplexed channels comprising a first light beam of a first wavelength containing a data channel and a second light beam of a second wavelength band containing plural information channels multiplexed together;

a narrow-band vertical diffraction grating facing said wideband vertical diffraction grating so that said second light beam is reflected therebetween whereby said narrow-band vertical diffraction grating transforms between said second light beam and a plural light beams carrying said plural information channels.

* * * * *